United States Patent [19]

Kobayashi et al.

[11] Patent Number: 5,455,538
[45] Date of Patent: Oct. 3, 1995

[54] LINEAR AMPLIFIER FOR AMPLIFYING A COMPOSITE SIGNAL OF PLURAL FREQUENCY COMPONENTS

[75] Inventors: Kazuhiko Kobayashi; Hiroyuki Seki; Naofumi Okubo; Toru Maniwa, all of Kawasaki, Japan

[73] Assignee: Fujitsu Limited, Kanagawa, Japan

[21] Appl. No.: 226,703

[22] Filed: Apr. 12, 1994

[30] Foreign Application Priority Data

Jun. 30, 1993 [JP] Japan ................. 5-189190

[51] Int. Cl.[6] ............................................. H03F 1/26
[52] U.S. Cl. ............................................. 330/149; 330/151
[58] Field of Search ............................... 330/124 R, 149, 330/151; 307/501, 520

[56] References Cited

U.S. PATENT DOCUMENTS

| | | | |
|---|---|---|---|
| 4,291,277 | 9/1981 | Davis et al. | 330/149 |
| 5,119,392 | 6/1992 | Childs | 330/149 X |
| 5,172,072 | 12/1992 | Willens et al. | 330/149 |

*Primary Examiner*—Steven Mottola

[57] ABSTRACT

A linear amplifier for amplifying a composite signal of plural frequency components to improve high efficiency without lowering the efficiency of a power load, includes a nonlinear amplifier circuit to which a signal having plural different frequency components is inputted, a 2nd-order distortion arithmetic circuit for generating and outputting a 2nd-order distortion component of the signal having the plural different frequency components, and an injection unit for injecting the 2nd-order distortion component to the signal having plural different frequency components. The nonlinear amplifier amplifies the signal injected with the 2nd-order distortion component.

17 Claims, 8 Drawing Sheets

LINEAR AMPLIFIER FOR AMPLIFYING A COMPOSITE SIGNAL OF PLURAL FREQUENCY COMPONENTS

BACKGROUND OF THE INVENTION

1. Field of the Invention

The present invention relates to a linear amplifier for amplifying a composite signal of plural frequency components. More particularly, the invention relates to an amplifier having a superior linearity without lowering an electric power load efficiency.

2. Description of the Related Prior Art

In general, a voltage waveform of an output signal of an amplifier has a harmonic distortion component.

A 2nd-order distortion component and a 3rd-order distortion component in the harmonic distortion component can not be ignored because of their amplitudes in comparison with a 1st-order component. The distortion components, the central frequency of which is a frequency of an input signal, are generally removed by a filter.

However, the 3rd-order distortion component, and more specifically, a 3rd-order intermodulation distortion component correlated to frequencies F1 and F2 is close to the frequency of the input signal, and therefore, it can not be removed by the filter, so that it is required to reduce the occurrence level of the 3rd-order distortion component to a lower level.

A method for removing this 3rd-order intermodulation distortion component was discussed in the article titled "A New Method of Third-Order Intermodulation Reduction in Nonlinear Microwave", pages 245 through 250 of IEEE [Transactions on Microwave Theory and Technics, Volume MTT 34, No.2] published in February 1986 .

According to the principle described in the article, the 3rd-order intermodulation distortion component can be removed by extracting the (F1–F2) component from the output of the amplifier and feed-backing it to the input side when the input signal has two frequency components F1 and F2. However, the device described in the abovementioned article is a feedback type distortion compensating amplifier.

As electric power is fed-back in the feedback type amplifier, the transmission gain is reduced by the feed-back amount. A feed-forward type amplifier may be used to solve this problem.

Figure 8:
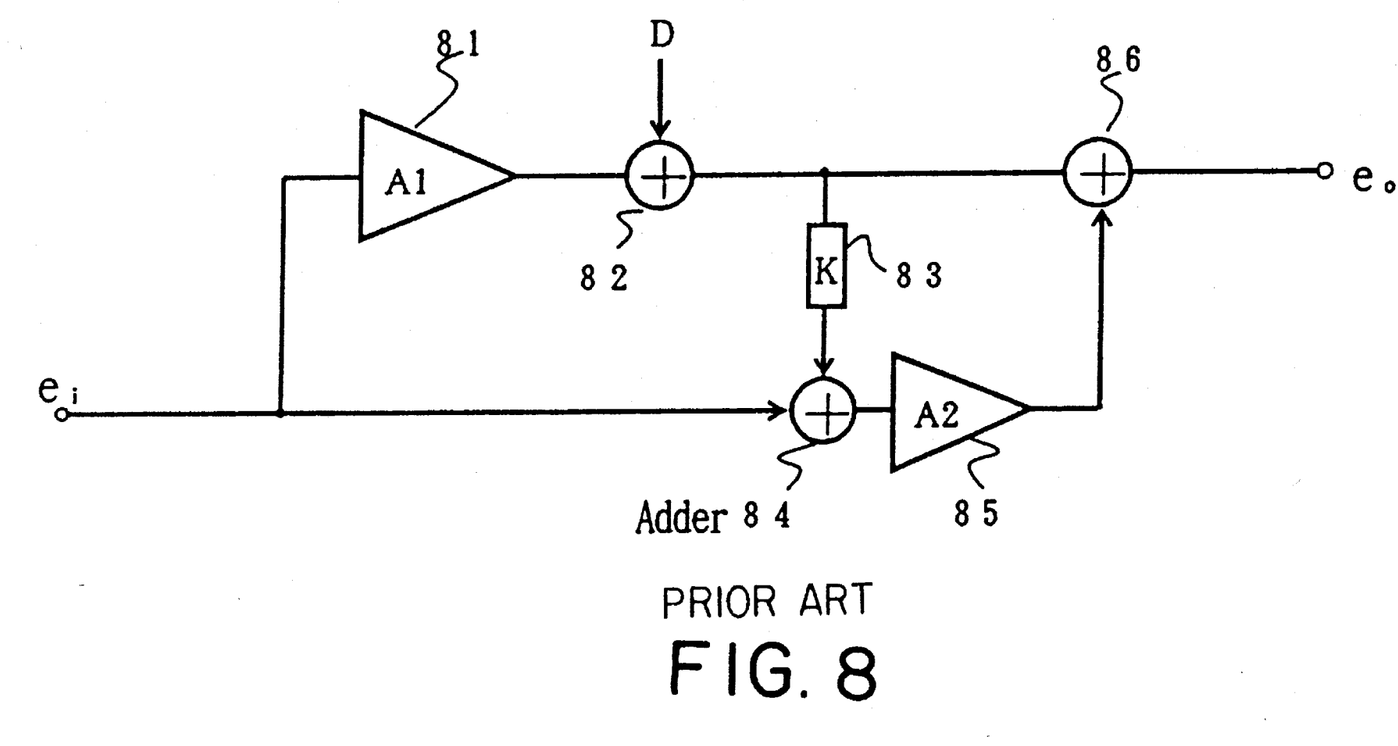
FIG. 8 is a block diagram showing a conventional feed-forward type distortion compensating circuit.

FIG. 8 shows an example of a circuit for compensating the distortion of a signal of the amplifier having the feed-forward type structure. FIG. 8 shows an example of a circuit for compensating distortion component D in the case where distortion component D is added in an amplifier 81 for amplifying the input $e_i$.

The system for compensating the distortion component shown in FIG. 8 constitutes the feed-forward type distortion compensating circuit. In FIG. 8, numeral "82" is an adder, in which distortion component D is added. "83" is a circuit having a coefficient K.

"84" is an adder for adding the input $e_i$ to the output of circuit 83 having coefficient K.

"85" is an auxiliary amplifier which has almost the same gain as main amplifier 81 and which amplifies the output of the adder 84. "86" is an adder for adding the output of the auxiliary amplifier 85 to the output of the main amplifier 81, added with distortion component D.

In the circuit of FIG. 8, when the output of adder 86 is $e_o$, the distortion D is compensated as shown in the following equation;

$$e_o = (A1 + A2 + A1A2k)e_i + (1 + kA2)D,$$

where, A1 and A2 are gains of the amplifier 81 and the amplifier 85, respectively. Further, when kA1 is equal to kA2 equal to −1, $e_o$ becomes equal to $Ale_i$, so that the distortion D is deleted.

Hereupon, the auxiliary amplifier 85 having almost the same gain as the main amplifier 81 is required for removing the distortion component D in the conventional circuit as shown in FIG. 8. Further, it is also required in order to maintain better efficiency to sufficiently improve the stability of each loop.

The distortion component generated in the auxiliary amplifier 85 is not reduced and the whole characteristic of the distortion is determined by the characteristic of the auxiliary amplifier 85.

Further, the efficiency of the amplifier becomes lower because the compensating circuits such as circuit 83 having coefficient k and an auxiliary amplifier are provided.

SUMMARY OF THE INVENTION

It is therefore an object of the present invention to provide a structure of the feed-forward type amplifier, which reduces the 3rd-order intermodulation distortion component without lowering the voltage load efficiency, and thus solves the problem of the above-described conventional amplifier.

A linear amplifier according to the present invention comprises a nonlinear amplifier circuit, to which a signal having plural different frequency components is inputted; a 2nd-order distortion arithmetic circuit for generating and outputting a 2nd-order distortion component of the signal having plural different frequency components; and means for injecting the 2nd-order distortion component to the signal having plural different frequency components; said nonlinear amplifier amplifying the signal injected with the 2nd-order distortion component.

According to another aspect of the present invention, a linear amplifier comprises plural signal sources for outputting plural different frequency signals; a signal composition circuit connected to the plural signal sources for composing a composite signal from the plural different frequency signals outputted from the plural signal sources; a 2nd-order distortion arithmetic circuit for calculating and outputting a 2nd-order distortion component of the plural different frequency signals of the plural signal sources; means for injecting the 2nd-order distortion component outputted from the 2nd-order arithmetic circuit, to the composite signal; and a nonlinear amplifier connected to the outputs of the plural signal sources for amplifying the signal injected with the 2nd-order distortion component outputted from the 2nd-order distortion arithmetic circuit.

According to a further aspect of the present invention, a linear amplifier comprises first and second signal sources for outputting two signals having different frequency components F1 and F2, respectively; a signal composition circuit connected to the signal sources for composing a composite signal from the two signals outputted from the signal sources; a 2nd-order distortion arithmetic circuit for calculating and outputting a frequency difference component (F1–F2) of the two signals outputted from the two signal sources; means connected to the 2nd-order distortion arithmetic circuit for injecting the frequency difference component (F1–F2) to the composite signal; and a nonlinear amplifier connected to the signal composition circuit for amplifying the composite signal injected with the frequency difference component.

Other objects and advantages of the present invention will become apparent from the following detailed description taken in conjunction with the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENTS

Throughout the following descriptions of embodiments of the present invention, identical reference numerals or symbols are used to designate identical or similar elements.

Before explaining embodiments of the present invention, the principle of the invention is first described in connection with FIG. 1, for the better understanding of the invention.

Figure 1:
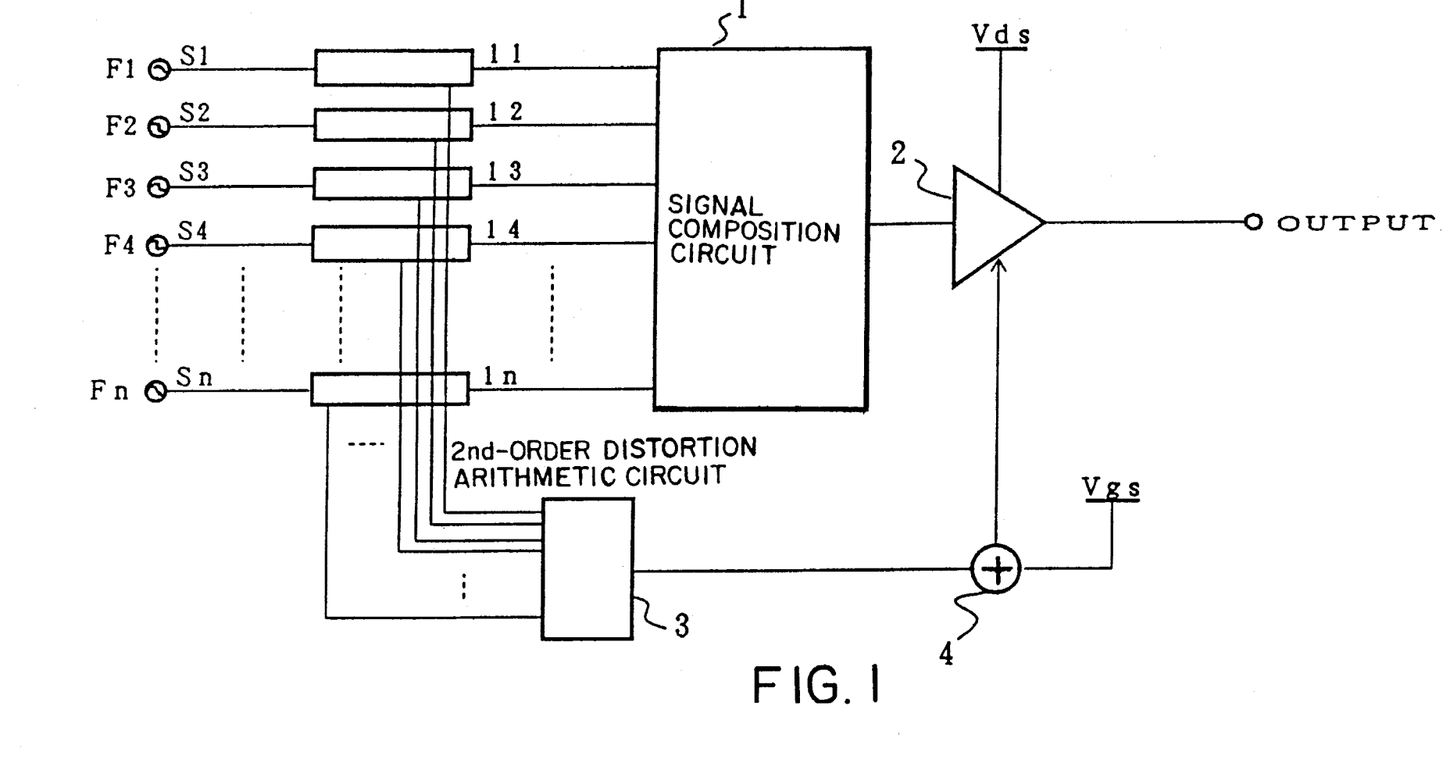
FIG. 1 is a block diagram for explaining the principle of the present invention.

As shown in FIG. 1, a linear amplifier according to the present invention has a nonlinear amplifier circuit 2 to which a signal having a plurality of frequency components is inputted, and a 2nd distortion arithmetic circuit 3 for calculating and outputting the 2nd-order distortion component of the signal having plural frequency components, The 2nd-order distortion component outputted from the 2nd-order distortion arithmetic circuit 3 in injected to the signal having plural different frequencies. The nonlinear amplifier circuit 2 amplifies the signal in which the 2nd-order distortion component is injected.

The principle of the present invention is now explained with reference to FIG. 1. In FIG. 1, S1, S2 . . . Sn are plural signal sources. Reference numeral "1" is a signal composition circuit, which is connected to the plural signal sources S1, S2 . . . Sn, and outputs a composite signal of plural frequencies F1–Fn. 11, 12, . . . 1n are power distributors. The signals of each of signal sources S1, S2 . . . Sn are inputted to the signal composition circuit 1 via power distributors 11, 12. . . 1n.

On the other hand, the outputs of the power distributors 11, 12, . . . 1n are supplied to the 2nd-order distortion arithmetic circuit 3. The 2nd-order distortion component is calculated by and outputted from the 2nd-order distortion arithmetic circuit 3.

The nonlinear amplifier circuit 2 has, for example, a nonlinear amplifying element FET. "4" is an adding circuit for adding the 2nd-order distortion component, which is the output of the 2nd-order distortion arithmetic circuit 3, and the bias voltage Vgs. The output of the adding circuit 4 is supplied to the nonlinear amplifier circuit 2.

The linear amplifier according to the present invention is constituted as one of the feed-forward type, so that it becomes possible to inject the 2nd-order distortion component to the nonlinear amplifier circuit 2. Accordingly, it becomes possible to remove the 3rd-order intermodulation distortion component described in the above-mentioned article.

Figure 2:
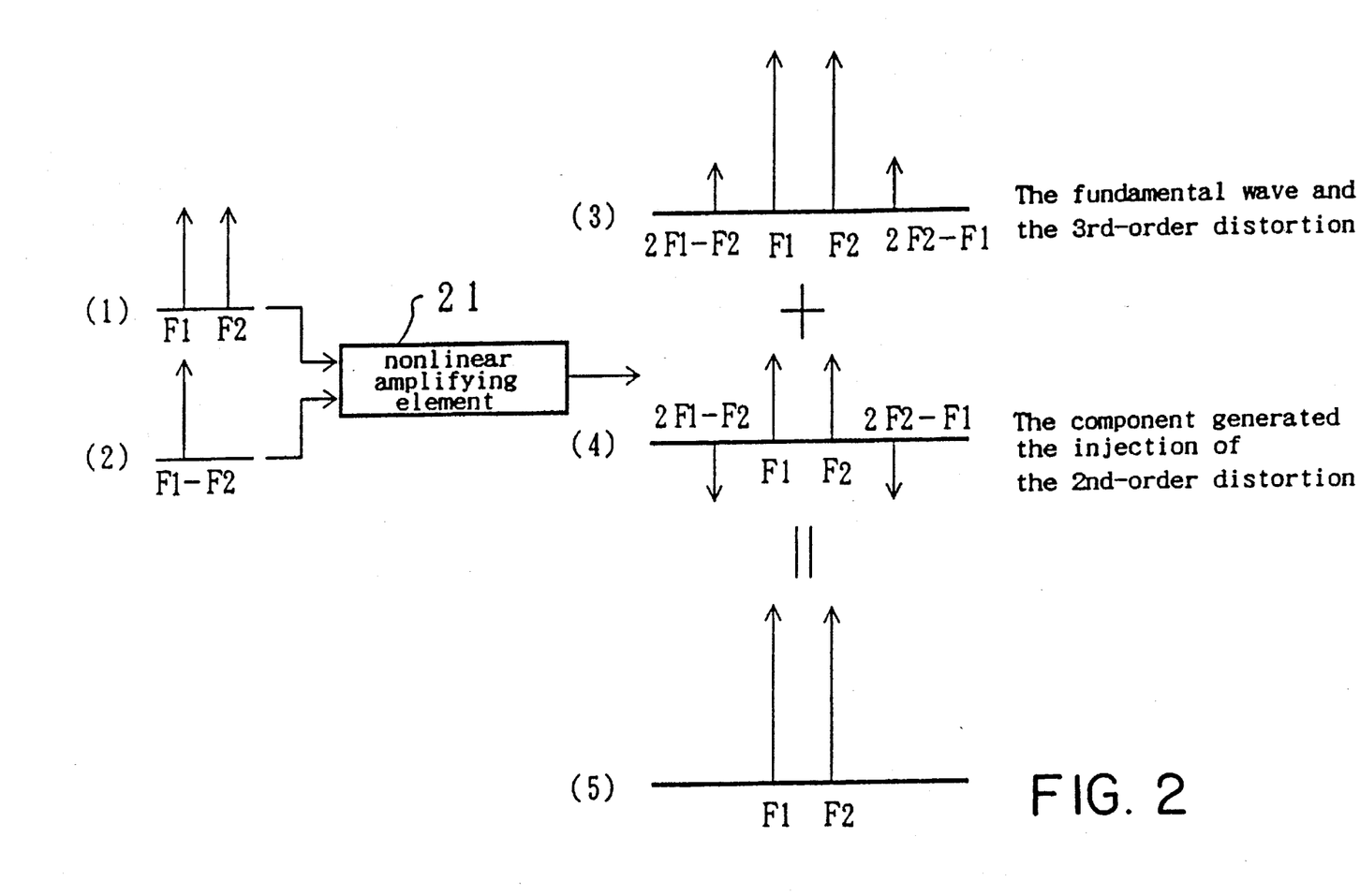
FIG. 2 is an explanatory diagram showing a distortion compensation of the present invention depending on a 2nd distortion component injection.

FIG. 2 is an explanatory diagram showing the principle of compensation of the distortion in the signal, depending on injection of the 2nd-order distortion component in the linear amplifier of the present invention. In FIG. 2, part (1) shows spectrums of two signals S1 and S2 having frequency components F1 and F2.

Part (2) of FIG. 2 is the spectrum of the difference (F1–F2) of frequency components F1 and F2 of two signals from signal sources S1 and S2, which difference is calculated and outputted as the 2nd-order distortion components of the frequency components F1 and F2 of two signals S1 and S2 by the 2nd-order distortion arithmetic circuit 3.

These two signals S1 and S2 are inputted to the nonlinear amplifying elements 21, each of which is a structural element of the nonlinear amplifier circuit 2. The difference (F1–F2) of the two frequency components from the 2nd-order distortion arithmetic circuit 3 is injected to the nonlinear amplifying element 21 as the 2nd-order distortion component.

Part (3) of FIG. 2 shows the spectrum components which are obtained from the two signals S1 and S2 passed through the nonlinear amplifying element 21 in which the fundamental wave components F1 and F2 and the 3rd-order distortion components (2F1–F2) and (2F2–F1) are generated.

Part (4) of FIG. 2 shows the spectrum components generated by the injection of the 2nd-order distortion component. Accordingly, the 3rd-order distortion components (2F2–F2) and (2F2–F1) are cancelled from the signal output from the nonlinear amplifying element 21 and only fundamental wave components F1 and F2 are outputted as shown in part (5) of FIG. 2.

Next, the operation principle of the present invention in common for each embodiment will be explained, using numerical expressions.

In the case where the input signals are two frequency waves, the input signal $e_i$ becomes as follows:

$$e_i = A \cos(at + \Theta a) = B \cos(bt + \Theta b) \qquad (1)$$

In general, the output voltage waveform of the amplifier includes a harmonic component and can be expressed by the following equation:

$$e_o = k_1 e_i + k_2 e_i^2 + k_3 e_i^3 + k_4 e_i^4 + \qquad (2)$$

According to the above described equations, the equation (1)

is then substituted by the equation (2). Here, the order is considered only up to the 3rd-order. The result of substituting becomes as follows:

THE 1ST ORDER COMPONENT ($k_1 e_i$)

$$k_1 A \cos(at+\Theta a) + k_1 B \cos(bt+\Theta b) \tag{3}$$

THE 2ND-ORDER COMPONENT ($k_2 e_i^2$)

$$k_2(A^2/2 + B^2/2) \tag{4}$$

$$k_2 AB \cos\{(a+b)t + (\Theta a + \Theta b)\} \tag{5}$$

$$k_2 AB \cos\{(a-b)t + (\Theta a - \Theta b)\} \tag{6}$$

$$\tfrac{1}{2} k_2 A^2 \cos 2(at+\Theta a) + \tfrac{1}{2} k_2 B^2 \cos 2(bt+\Theta B) \tag{7}$$

THE 3RD ORDER COMPONENT ($k_3 e_i^3$)

$$\tfrac{1}{4} k_3 A^3 \cos(3at+3\Theta a) + \tfrac{1}{4} k_3 B^3 \cos(3bt+3\Theta b) \tag{8}$$

$$\tfrac{3}{4} k_3 [A^2 B \cos\{(2a+b)t+(2\Theta a+\Theta b)\} + AB^2 \cos\{(2b+a)t+(2\Theta b+\Theta a)\}] \tag{9}$$

$$\tfrac{3}{4} k_3 [A^2 B \cos\{(2a+b)t+(2\Theta a+\Theta b)\} + AB^2 \cos\{(2b+a)t+(2\Theta b+\Theta a)\}] \tag{10}$$

$$\tfrac{3}{4} k_3 (A^3 \cos(at+\Theta a) + B^3 \cos(bt+\Theta b)) \tag{11}$$

$$\tfrac{3}{2} k_3 [A^2 B \cos(bt+\Theta b) + AB^2 \cos(at+\Theta a)] \tag{12}$$

According to the above-described result, the waveform outputted actually becomes as follows:

$$e_o = (k_1 A + \tfrac{3}{4} k_3 A^3 + \tfrac{3}{2} k_3 AB^2) \cos(at+\Theta a) + (k_1 B + \tfrac{3}{4} k_3 B^3 + \tfrac{3}{2} k_3 A^2 B) \cos(bt+\Theta b) + \tfrac{3}{4} k_3 [A^2 B \cos\{(2a-b)t + (2\Theta a - \Theta b)\} + AB^2 \cos\{(2b-a)t + (2\Theta b - \Theta a)\}]$$

Hereupon, if placed $A = B = 1$, $k_1 \gg k_3$, the above-described equation becomes as follows:

$$e_o = k_i \{\cos(at+\Theta a) + \cos(bt+\Theta b)\} + \tfrac{3}{4} k_3 [\cos\{(2a-b)t + (2\Theta a - \Theta b)\} + \cos\{(2b-a)t + (2\Theta b - \Theta a)\}]$$

Moreover, if the phase components $\Theta a$ and $\Theta b$ are 0, the equation becomes as follows:

$$e_o k_1 + (\cos at + \cos bt) + \tfrac{3}{4} k_3 \{\cos(2a-b)t + \cos(2b-a)t\} \tag{13}$$

The equation (13) is as same as in FIG. 2 (3), judging from the spectrum.

The spectrums of the intermodulation distortion components (2a−b) and (2b−b) become problematic. Although the consideration is made only of the 3rd-order here, the above-described spectrum spreads from side to side, if all orders are considered.

The main object of the present invention is to reduce the above-described spectrums (2a−b, 2b−a).

Therefore, the third order interpolation distortion component (IM3) can be reduced by adding the 2nd-order components of the above-described equation (6) which are the output components of the amplifier, to the input of the same amplifier or adding the generated components to the input side.

The following explanation is to prove the above statement:

The input signal of the amplifier is placed as follows:

$$e_1 = \cos at + \cos bt + 2\cos(a-b)t \tag{14}$$

$e_o$ is found by substituting the above-described equation with the equation (2).

THE 1ST ORDER COMPONENT ($k_1 e_i$)

$$k_1 \cos at + k_1 \cos bt + k_1 2 \cos(a-b)t$$

$$k_1 \cos at + k_1 \cos bt + k_1 2 \cos(b-a)t$$

Hereupon, the 2nd-order component is not included.

THE 3RD-ORDER COMPONENT ($k_1 e_i^3$)

Here only the 3rd-order intermodulation distortion (IM3) is considered.

$$\tfrac{3}{4} k_3 \cos(2a-b)t$$

$$\tfrac{3}{4} k_3 \alpha \cos(a-b)t$$

$$\tfrac{3}{4} k_3 \cos(2b-a)t$$

$$\tfrac{3}{4} k_3 \alpha \cos(b-a)t$$

$$\tfrac{3}{4} k_3 \alpha^2 \cos(a-2b)t$$

$$\tfrac{3}{4} k_3 \alpha^2 \cos(b-2A)t$$

If $\alpha = 1$ and IM3 components are added, the equation becomes as follows:

$$\tfrac{3}{4} k_3 \{\cos(a-b)t + \cos(b-a)t\}$$

As seen from the above-described result, the IM3 components are lost and the output has only the following fundamental components:

$$e_o = k_1 \cos at + k_1 \cos bt$$

That is, it becomes possible to remove the 3rd-order intermodulation distortion component (IM3) by adding the 2nd-order distortion component having the frequency (a−b) component, to the two input signals having the frequencies a and b.

Figure 3:
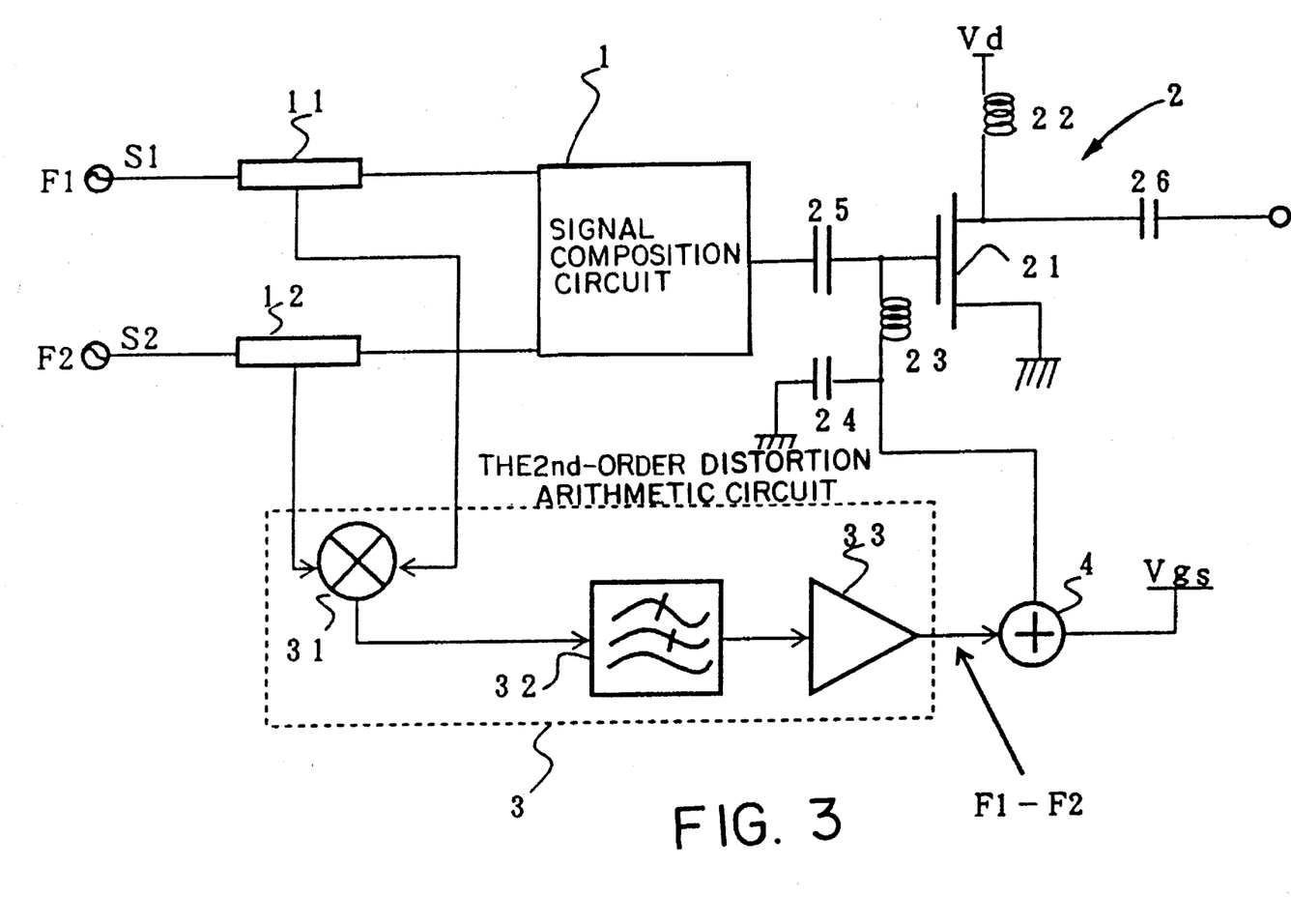
FIG. 3 is a block diagram showing a first embodiment of the present invention.

FIG. 3 is a block diagram showing a first embodiment of the present invention.

Same or like reference numerals are given to those components which correspond to each other or are identical. Furthermore, although it is explained that the plural signals having the different frequencies are mixed by the signal composition circuit 1, the amplifier according to the present invention is also used to amplify the composite signal of the plural frequencies already mixed.

The amplifier which is constituted so as to mix the plural signals having the different frequencies by the signal composition circuit 1, and amplify the signals is suitable for use in an end station or a repeater office. On the other hand, the amplifier for amplifying the signal which has been mixed with the plural frequency signals is suitable for use in a transponder and the like.

In FIG. 3, the input signals of frequencies F1 and F2 from the signal sources S1 and S2 are inputted to the power distributors 11 and 12, respectively.

The outputs of the power distributors 11 and 12 are inputted to the signal composition circuit 1 (for example, a hybrid circuit).

The two signals inputted to the signal composition circuit 1 are composed and the output of the circuit 1 is inputted to the FET 21, which is a nonlinear amplifying element through a capacitor 25 for cutting direct current.

The nonlinear amplifying element 21 has a high-frequency stopping coil 23 which is connected to the gate of the nonlinear amplifying element 21. A capacitor 24 is connected between coil 23 and ground and a coil 22 is provided between the drain voltage source Vd and the drain of the FET 21. The nonlinear amplifying element 21, coils 22, 23 and capacitor 24 constitute the amplifier circuit 2.

The operating condition of the nonlinear amplifier is to be B class or C class having high efficiency. The signal amplified by the nonlinear amplifier circuit 2 is outputted through a capacitor 26 for cutting direct current.

On the other hand, the outputs of the power distributors 11 and 12 are outputted to the 2nd-order distortion arithmetic circuit 3. The 2nd-order distortion arithmetic circuit 3 includes a mixer 31, a low-pass filter 32 and an arithmetic amplifier 33. The outputs from the power distributors 11 and 12 are inputted to the mixer. The mixer 31 is a multiplier for outputting the signal indicative of the sum of those inputs and the difference of two signal frequencies F1 and F2. That is, the mixer 31 outputs the frequency components of (F1–F2) and (F1+F2).

The low-pass filter 32 filters and passes only the signal having the difference component (F1–F2) corresponding to the 2nd-order distortion component selected from these components. Then, the difference component (F1–F2) outputted from the low-pass filter 32 is inputted to the amplifier 33.

The amplifier 33 is an operational amplifier which amplifies the output of the low-pass filter 32 to a fixed level.

In FIG. 3, a multiplier 4 adds the 2nd-order distortion component amplified to the fixed level outputted from the amplifier 33 of the 2nd-order distortion arithmetic circuit 3, to the gate bias voltage Vgs. The output of the multiplier 4 is supplied to the gate of the FET 21.

Figure 4:
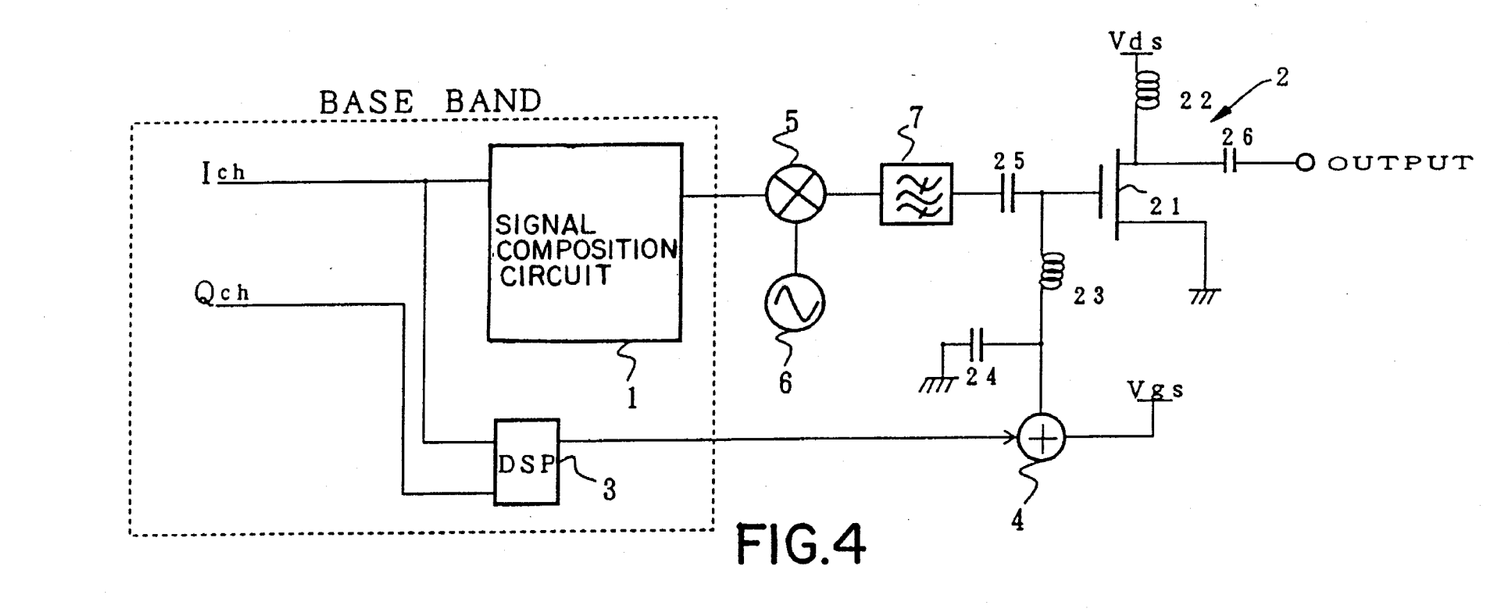
FIG. 4 is a block diagram showing a second embodiment of the present invention.

FIG. 4 is a block diagram showing a second embodiment of the present invention, for the case where the orthogonal signals of I channel and Q channel of the base band are inputted as the input signals.

As in the first embodiment, the base band signals of I channel and Q channel are inputted to the signal composition circuit, where they are composed and from which they are outputted.

In FIG. 4, 5 is a mixer for mixing the output of the signal composition circuit 1 with the RF frequency signal of an RF oscillator 6. The output of the mixer 5 is passed through a band-pass filter 7 whose output is inputted to the gate of the FET 21, which is the nonlinear amplifying element through the capacitor 25 for cutting direct current.

The FET 21 having the high-frequency stopping coil 23, capacitor 24 and coil 22 connected to the drain power source Vds, constitutes the nonlinear amplifier circuit 2.

Then, each setting value is determined so that the nonlinear amplifier circuit 2 is operated with the level of class B or class C.

The output of the amplifier circuit 2 is outputted through the capacitor for cutting direct current 26.

On the other hand, each channel signal of the base band is inputted to the 2nd-order distortion arithmetic circuit 3 which may be constituted by a digital signal processor (DSP) and the like.

The output of the 2nd-order distortion arithmetic circuit 3 is an analog signal having the required level which is inputted to the adding circuit 4. In the adding circuit 4, the output of the 2nd-order distortion arithmetic circuit 3 is composed with the gate bias voltage Vgs, and the resulting composite signal is inputted to the gate of the FET 21, which is the nonlinear amplifying element.

In this embodiment, the 3rd-order intermodulation distortion component is reduced due to operation on the same principle as that of the abovedescribed circuit of FIG. 1.

Figure 4A:
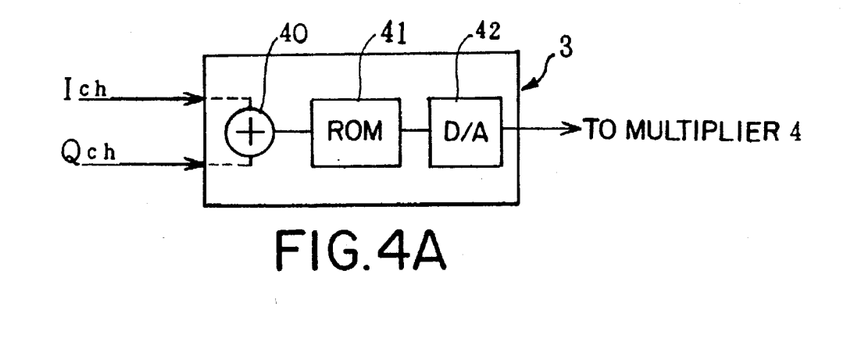
FIG. 4A schematically shows a digital signal processor of the embodiment of FIG. 4.

In the case where the 2nd-order distortion arithmetic circuit 3 is constituted by a DSP or the like, it includes a multiplier 40, a ROM circuit 41 and a digital/analog converting circuit 42, as shown in FIG. 4A.

That is, the DSP performs the multiplication of the base band signal by the multiplier 40, reads out the stored digital value corresponding to the result of the multiplication from the ROM circuit 41, and converts the read-out digital value to the analog signal in the digital/analog converting circuit 42.

Figure 5:
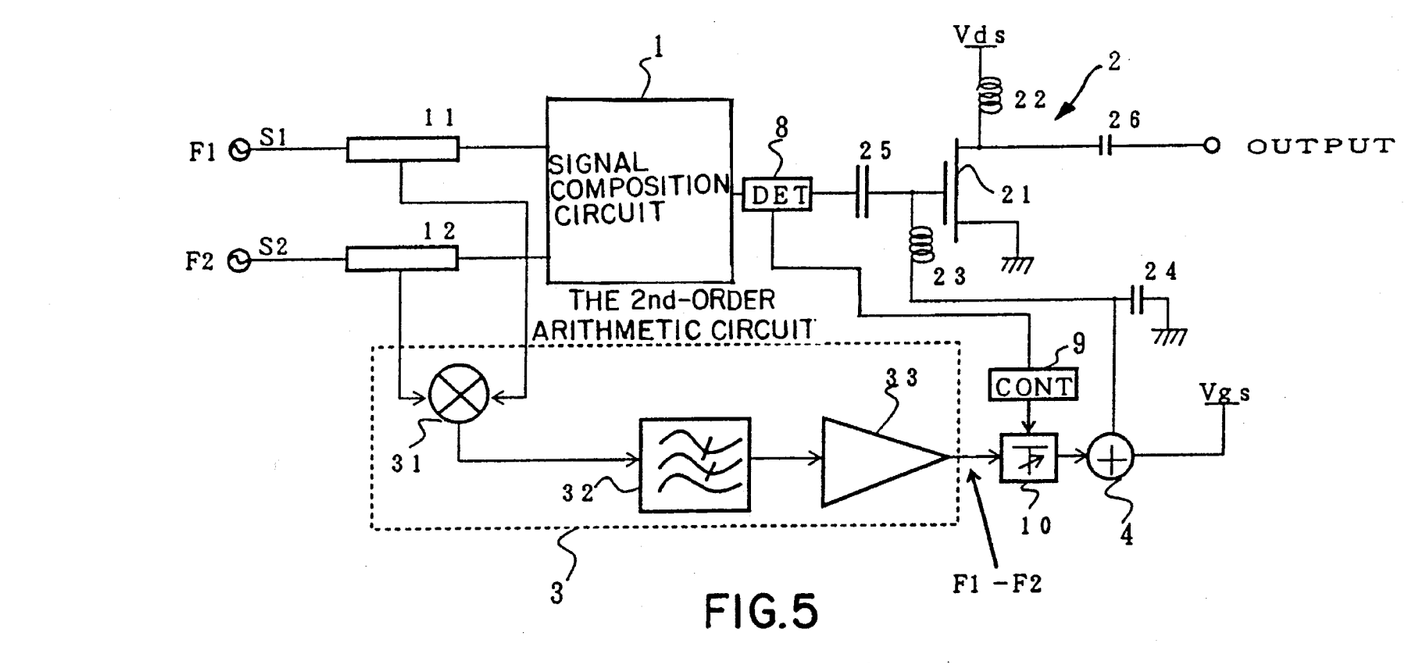
FIG. 5 is a block diagram showing a third embodiment of the present invention.

FIG. 5 is a block diagram showing a third embodiment of the present invention.

The basic structure of the third embodiment is the same as that of the first embodiment.

The difference between the embodiment of FIG. 5 and the first embodiment is that a detector circuit 8, a control circuit 9 and a voltage control type variable attenuator 10 are provided.

The input signals S1 and S2 are inputted to the signal composition circuit (a hybrid circuit or the like) 1 via the power distributors 11 and 12, respectively. The output of circuit 1 is passed through the capacitor 25 for cutting direct current and inputted to the FET 21, which is the nonlinear amplifying element of the nonlinear amplifier circuit 2. Here, the operating condition of the amplifier, 2 is of class B or class C having a high efficiency. The amplified signal is outputted through the capacitor 26 for cutting direct current.

On the other hand, the outputs of the power distributors 11 and 12 are inputted to the 2nd-order distortion arithmetic circuit 3.

The third embodiment is similar to that of the first embodiment shown in FIG. 3, in the structure of the 2nd-order distortion arithmetic circuit 3 and the function of generating the component of the frequency difference (F1–F2), which is the 2nd-order distortion component.

Meanwhile, the signal of the detector circuit 8 is inputted to the voltage control type variable attenuator 10 via the control circuit 9. Here, the detector circuit 8 detects the output level of the signal composition circuit 1 and outputs the signal corresponding to the detected level.

Figure 5A:
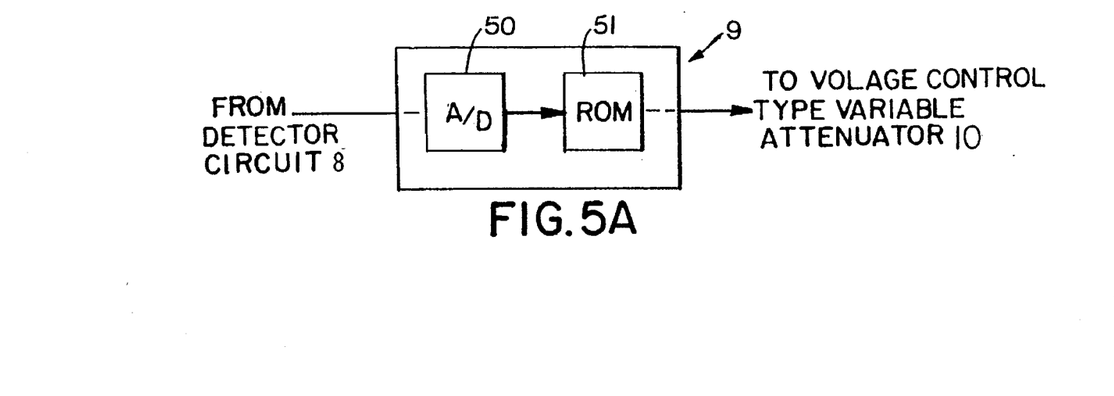
FIG. 5A schematically shows a controller of the embodiment of FIG. 5.

The control circuit 9, which has a converting circuit 50 for converting the power component received from detector circuit 8, and a ROM circuit 51, as shown in FIG. 5A, operates so as to add the suitable level of the 2nd-order distortion component signal, to the input level of the FET 21. The input signal is passed from the detector circuit 8 through a low-pass filter and is converted to a digital signal.

The digital signal is inputted to ROM 51, in which the suitable attenuation amount for the voltage control type variable attenuator 10 is written, corresponding to the input level of the FET 21 in advance, and the control signal corresponding to the attenuation amount is read-out from the ROM.

Further, the output of the ROM is converted to the analog signal, and inputted to the voltage control type variable attenuator 10 as the control signal.

The relation between the attenuation amount of the voltage control type variable attenuator 10 and the output of the amplifier circuit 2 is as follows. When the output of the signal composition circuit 1, that is, the input of the amplifier circuit 2, becomes larger, the attenuation amount of the voltage control type variable attenuator 10 is controlled to become smaller, and the output from the 2nd-order distortion arithmetic circuit 3 injected to the amplifier circuit 2 via the adding circuit 4 becomes larger accordingly.

Therefore, it becomes possible to make the injected amount of the output from the 2nd-order distortion arithmetic circuit correspond to the input level of the signals S1 and S2, and it also becomes possible to more accurately reduce the 3rd-order intermodulation distortion component (IM3).

It also becomes possible to provide the controller, with an operational amplifier of analog type so as to control the voltage type variable attenuator 10 by a signal corresponding to the difference between a reference signal and the output from the detector 8.

The voltage control type variable attenuator 10 may control the upper value and lower value of the attenuation amount by the fixed attenuation amount as the middle value. Further, when the offset is formed at the controller 9 and the output of the detector 8 exceeds the fixed value, it is possible to provide the control so as to change the attenuation amount of the voltage control type variable attenuator 10.

Figure 6:
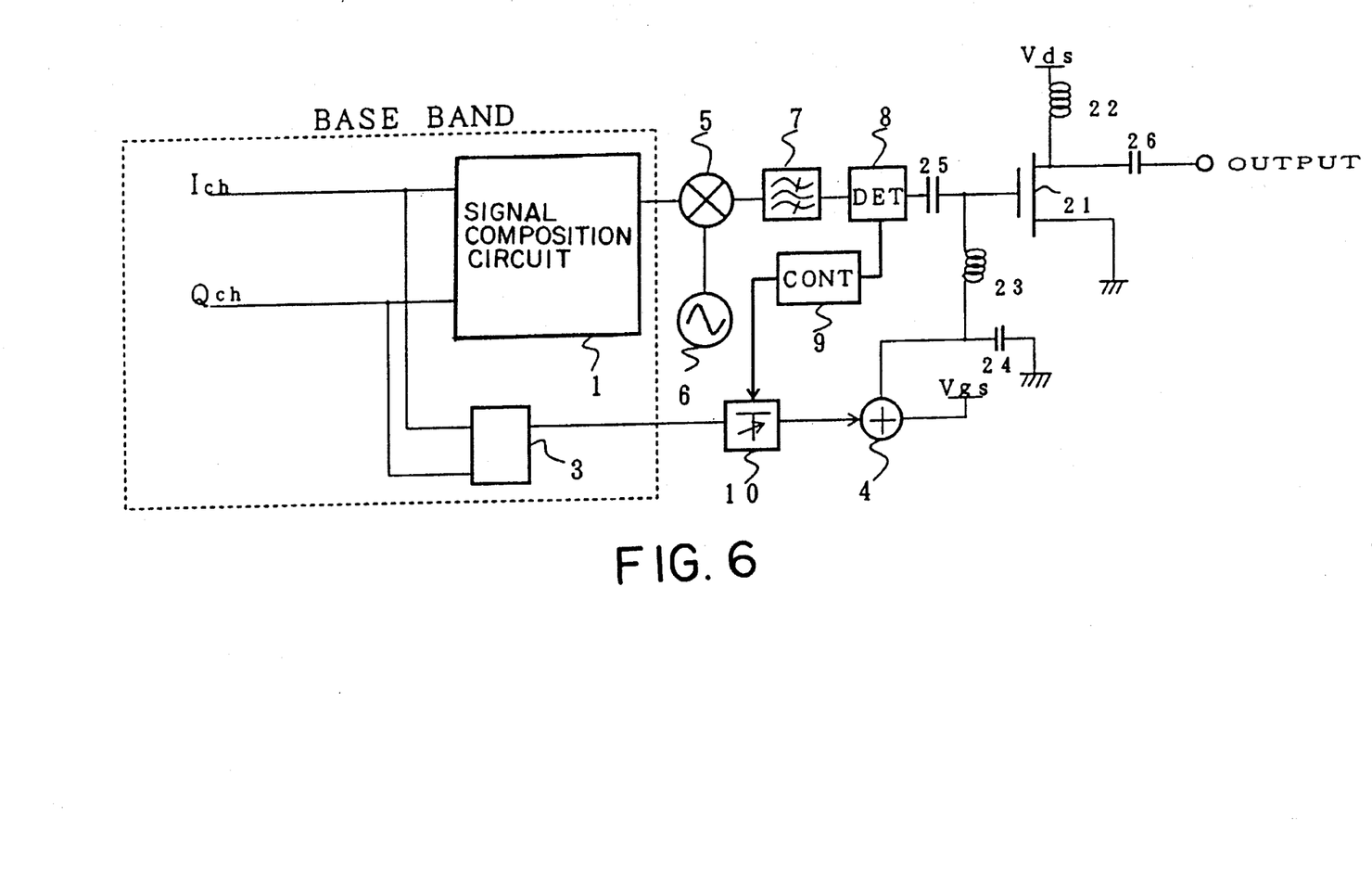
FIG. 6 is a block diagram showing a fourth embodiment of the present invention.

FIG. 6 is a block diagram of a fourth embodiment of the present invention.

In the embodiment of FIG. 6, the detector circuit 8, the control circuit 9 and the voltage control type variable attenuator 10 are provided as in the second embodiment of FIG. 4, to make the injected amount of the output from the 2nd-order distortion arithmetic circuit correspond to the input level of the signals S1 and S2, similarly the above-described embodiment of FIG. 5.

The structure of FIG. 6 differs from the embodiment of FIG. 5 in that the output is a base band signal in the embodiment of FIG. 6, in contrast to the output from signal composition circuit 1 being an RF signal in the embodiment of FIG. 5.

Accordingly, in the embodiment of FIG. 6, the output of the signal composition circuit 1 is multiplied with the carrier output of the oscillator 6 at the multiplier 5 and is inputted to the detector circuit 8 via the filter 7. The remaining operation is the same as that of the embodiment of FIG. 5.

Figure 7:
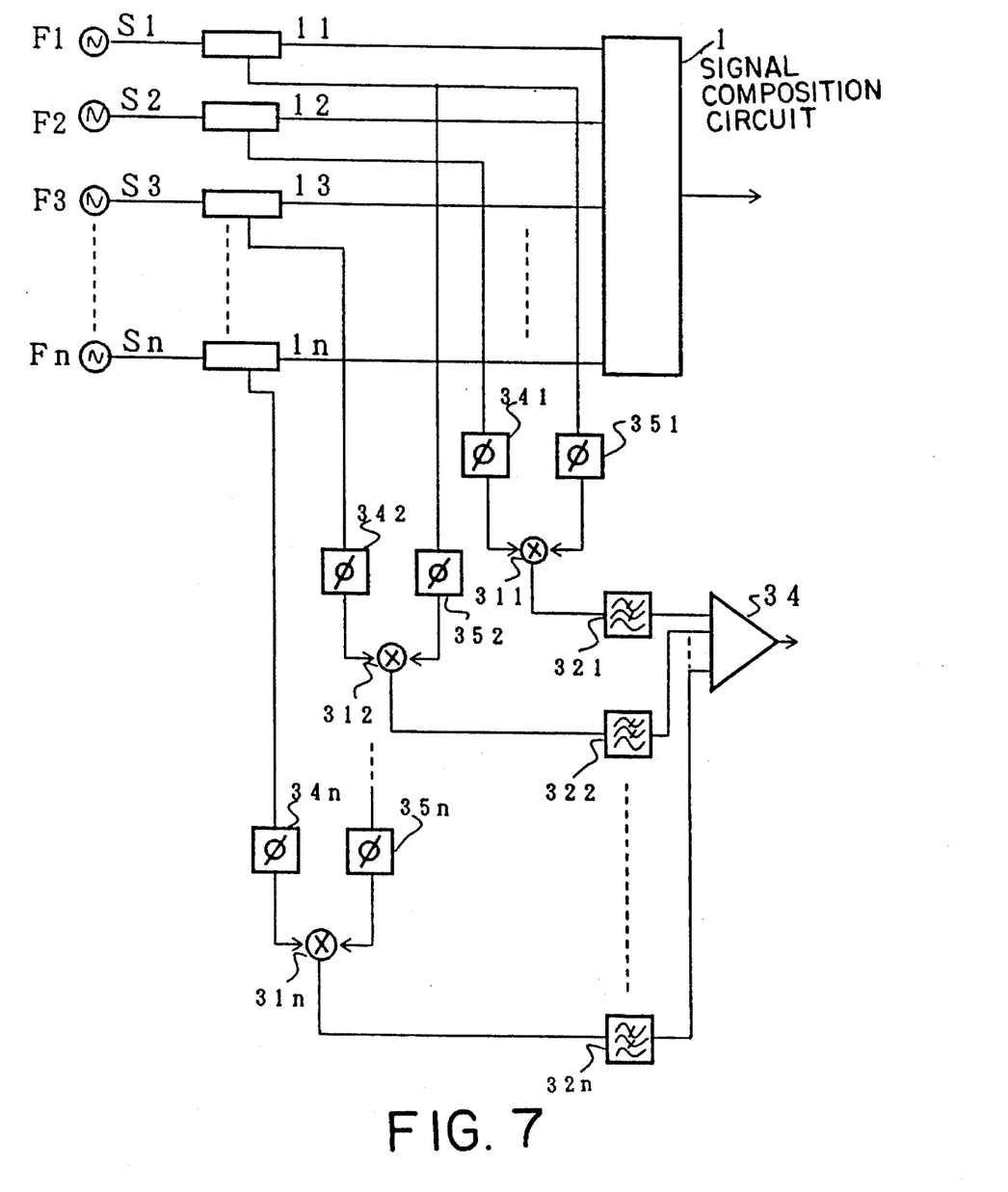
FIG. 7 is a block diagram showing a fifth embodiment of the present invention.

FIG. 7 is a block diagram of the fifth embodiment of the present invention, where the signals of the plural signal sources S1, S2 ... Sn are inputted to the 2nd-order distortion arithmetic circuit.

FIG. 7, 311, 312 ... 31n are multipliers, 341, 342 ... 34n and 351, 352 ... 35n are phase control circuits which control the phase between the two inputs inputted to the corresponding multiplying circuit and which make it possible to perform the exact multiplication.

321, 322, ... 32n are low-pass filters, and 34 is an adder constituted by an operational amplifier and the like, for adding the outputs of the low-pass filters 321, 322 ... 32n.

As the described above, the 2nd-order distortion arithmetic circuit 3 is constituted by the multipliers 311, 312, ... 31n, phase control circuits 351, 352 ... 35n, low pass filters 321, 322 ... 32n, and adder 34.

In FIG. 7, the multiplier 311 performs the multiplication of the signals having each frequencies F1 and F2 from the signal sources S1 and S2. As the result of multiplying, the signals of the frequency components (F1+F2) and (F1−F2) are outputted. The low-pass filter 321 filters the frequency (F1−F2) component, that is, the 2nd-order distortion frequency component and inputs it to the adder 34.

At the same time, the multiplier 312 and the low-pass filter 322 generate the 2nd-order distortion component of the signals from the signal sources S1 and S3 and input it to adder 34.

Four signals having the frequencies F1–F4 components will be now considered. In this case, the combination of the frequency difference components (F1−F2), (F1−F3), (F2−F3), (F1−F4) and (F3−F4) can be formed.

Accordingly, the six multipliers and the low-pass filters corresponding to the number of multipliers are required, based on the same principle as the principle described above. However, in the case where the ranges of the frequencies of the four signals are equal, the frequency difference components (F2−F3), (F2−F4) and (F3−F4) may be omitted and thus the corresponding multipliers and the low-pass filter can be omitted.

According to the present invention as described above, it is possible to improve the circuit for reducing the 3rd-order intermodulation distortion component which occurs in the nonlinear amplifier of the feed-forward type.

It is also possible to improve the amplifier having a superior linearity without lowering an electric power load efficiency. The present invention may be embodied in other specific forms without departing from the spirit or essential characteristics thereof.

The described embodiments are therefore to be considered in all respects as illustrative and not restrictive, the scope of the invention being indicated by the appended claims rather than by the foregoing description and all changes, which come within the meaning and range of equivalency of the claims therefore are intended to be embraced therein.

What is claimed is:

1. A linear amplifier for amplifying a composite signal of plural frequency components, comprising:

a nonlinear amplifier circuit to which the composite signal of plural different frequency components is inputted;

a 2nd-order distortion arithmetic circuit for generating and outputting a 2nd-order distortion component of the composite signal; and means for injecting the 2nd-order distortion component to the composite signal of plural different frequency components, said nonlinear amplifier amplifying the composite signal injected with the 2nd-order distortion component and outputting an amplified signal from which a third order intermodulation distortion component is removed as a result of injection of the 2nd-order distortion component.

2. A linear amplifier for amplifying a composite signal of plural frequency components, comprising:

plural signal sources for outputting plural different frequency signals;

a signal composition circuit connected to the plural signal sources for composing a composite signal from the plural different frequency signals output from the plural signal sources;

a 2nd-order distortion arithmetic circuit for calculating and outputting a 2nd-order distortion component of the plural different frequency signals output from the plural signal sources;

means for injecting the 2nd-order distortion component output from the 2nd-order arithmetic circuit to the composite signal; and a nonlinear amplifier connected to the signal composition circuit and said injecting means for amplifying the composite signal injected with the 2nd-order distortion component outputted from the 2nd-order distortion arithmetic circuit and outputting an amplified signal from which a third order intermodulation distortion component is removed as a result of injection of the 2nd-order distortion component.

3. A linear amplifier for amplifying a composite signal of plural frequency components, comprising:

first and second signal sources for outputting two signals having different frequency components F1 and F2, respectively;

a signal composition circuit connected to the first and second signal sources for composing a composite signal from the two signals of the signal sources;

a 2nd-order distortion arithmetic circuit for calculating and outputting a frequency difference component (F1−F2) of the two signals output from the two signal sources;

a means connected to the 2nd-order distortion arithmetic circuit for injecting the frequency difference component (F1−F2) to the composite signal output from the signal composition circuit; and a nonlinear amplifier connected to the signal composition circuit for amplifying the composite signal injected with the frequency difference component.

4. The linear amplifier according to claim 2, wherein said nonlinear amplifier has a FET, the composite signal output from said signal composition circuit is connected to the gate of the FET, and further comprising a gate bias voltage source for supplying a gate bias voltage, and an adding circuit for adding the output of said 2nd-order distortion arithmetic circuit with the gate bias voltage and connecting an added output to the gate of the FET.

5. The linear amplifier according to claim 4, wherein the signals output from said plural signal sources are RF signals, said signal composition circuit is a power composition device, and wherein plural power distributors, connected to the plural signal sources, are provided for distributing the plural signals output from the plural signal sources to said nonlinear amplifier and the 2nd-order distortion arithmetic circuit.

6. The linear amplifier according to claim 5, wherein said 2nd-order distortion arithmetic circuit includes a mixer circuit for multiplying the signals output from the plural signal sources and outputting multiplexed signals, a low-pass filter for filtering and outputting a frequency difference component of two signals of multiplexed outputs of said mixer circuit, and an amplifier for amplifying the frequency difference component output from said low-pass filter.

7. The linear amplifier according to claim 4, wherein the signals of said plural signal sources are base band signals; said 2nd-order distortion arithmetic circuit has a multiplier for multiplying the base band signals and outputting a multiplied signal, a ROM circuit for reading-out a digital value signal corresponding to the multiplied signal, and a digital/analog converting circuit for converting the digital value signal to a corresponding analog signal; and further there is comprised a RF converting circuit for converting the output from said signal composition circuit to a RF signal and supplying the RF signal to said nonlinear amplifying circuit.

8. The linear amplifier according to claim 7, wherein the multiplier, the ROM circuit and the digital/analog converting circuit of said 2nd-order distortion arithmetic circuit are composed of a digital signal processor (DBP).

9. The linear amplifier according to claim 7, wherein said base band signals are digital signals of I channel (CH) and Q channel (CH), which are orthogonal.

10. The linear amplifier according to claim 2, further comprising: a detector circuit connected to said signal composition circuit for detecting the output level of the signal composition circuit and outputting a power component;

a controller for outputting a control signal corresponding to the power component from the detector circuit; and a voltage control type variable attenuator connected to said 2nd-order distortion arithmetic circuit for adjusting the attenuation amount of the output level of the 2nd-order distortion arithmetic circuit according to the control signal of the controller.

11. The linear amplifier according to claim 10, wherein said controller has a converting circuit for converting the power component from said detector circuit to a digital signal and a ROM circuit for storing attenuation amounts corresponding to input levels of said nonlinear amplifying element and reading-out the attenuation amount corresponding to the digital signal from the converting circuit; and said voltage control type variable attenuator is controlled so as to output an attenuated signal corresponding to the attenuation amount.

12. The linear amplifier according to claim 10, wherein said controller is composed of an operational amplifier, which has an output offset and transfers a state of outputting, when the input of the operational amplifier becomes above or below a fixed voltage level.

13. The linear amplifier according to claim 10, wherein said voltage control type variable attenuator is controlled so as that the attenuation level of the voltage control type variable attenuator becomes smaller, when the output level of said signal composition circuit becomes larger.

14. The linear amplifier according to claim 1, wherein said 2nd-order distortion arithmetic circuit comprises:

plural mixer circuits for multiplying two signals from two signal sources of plural signal sources, plural phase shifting units for controlling the phase of signals inputted to each of the plural mixer circuits, plural low-pass filters, each corresponding to each of the plural mixer circuits, and an adding circuit for adding the outputs of the plural low-pass filters and outputting an added output signal.

15. The linear amplifier according to claim 14, wherein said nonlinear amplifier has a FET, a composite output signal of said signal composition circuit is connected to the gate of the FET, and wherein a gate bias voltage is provided, and said adding circuit adds the output of said 2nd-order distortion arithmetic circuit and the gate bias voltage and supplies the added output to the gate of the FET.

16. The linear amplifier according to claim 3, wherein said nonlinear amplifier has a FET, the composite signal output from said signal composition circuit is connected to the gate of the FET, and further comprising a gate bias voltage source for supplying a gate bias voltage, and an adding circuit for adding the output of said 2nd-order distortion arithmetic circuit with the gate bias voltage and connecting an added output to the gate of the FET.

17. The linear amplifier according to claim 2,
wherein said 2nd-order distortion arithmetic circuit comprises:
plural mixer circuits for multiplying two signals from two signal sources of plural signal sources,
plural phase shifting units for controlling the phase of signals inputted to each of the plural mixer circuits,
plural low-pass filters each corresponding to each of the plural mixer circuits, and an adding circuit for adding the outputs of the plural low-pass filters and outputting an added output signal.

* * * * *